United States Patent
Oh

(10) Patent No.: US 7,868,460 B2
(45) Date of Patent: Jan. 11, 2011

(54) SEMICONDUCTOR PACKAGE AND METHOD OF MANUFACTURING THE SAME

(75) Inventor: Yun-jin Oh, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 453 days.

(21) Appl. No.: 11/982,751

(22) Filed: Nov. 5, 2007

(65) Prior Publication Data

US 2008/0136044 A1 Jun. 12, 2008

(30) Foreign Application Priority Data

Dec. 7, 2006 (KR) .................. 10-2006-0124063

(51) Int. Cl.
*H01L 23/52* (2006.01)
*H01L 23/48* (2006.01)
*H01L 29/40* (2006.01)

(52) U.S. Cl. .............. 257/775; 257/E23.032; 257/666; 257/780; 438/121

(58) Field of Classification Search .......... 257/E21.506, 257/E23.169, E23.031, E23.032, E23.037, 257/666, 670, 674, 775, 780; 438/121, 638; 174/250, 260; 361/776
See application file for complete search history.

(56) References Cited

U.S. PATENT DOCUMENTS

| | | | | |
|---|---|---|---|---|
| 6,040,984 A * | 3/2000 | Hirakawa | ................ | 361/777 |
| 6,069,408 A * | 5/2000 | Honda et al. | ................ | 257/787 |
| 6,291,898 B1 * | 9/2001 | Yeh et al. | .................... | 257/786 |
| 6,476,506 B1 * | 11/2002 | O'Connor et al. | .......... | 257/786 |
| 6,495,773 B1 * | 12/2002 | Nomoto et al. | ............ | 174/260 |
| 6,534,879 B2 * | 3/2003 | Terui | ......................... | 257/786 |
| 6,693,359 B1 * | 2/2004 | Lin | ............................ | 257/774 |
| 6,713,881 B2 * | 3/2004 | Umehara et al. | ............ | 257/786 |
| 6,812,580 B1 * | 11/2004 | Wenzel et al. | ............... | 257/784 |
| 6,900,545 B1 * | 5/2005 | Sebesta et al. | .............. | 257/775 |
| 7,102,216 B1 * | 9/2006 | Foster | ........................ | 257/673 |
| 7,339,258 B2 * | 3/2008 | Punzalan et al. | ............ | 257/666 |
| 7,510,912 B2 * | 3/2009 | Caletka et al. | ............. | 438/122 |
| 7,598,599 B2 * | 10/2009 | Chow et al. | .................. | 257/666 |
| 7,701,049 B2 * | 4/2010 | Do et al. | ..................... | 257/691 |

FOREIGN PATENT DOCUMENTS

JP 05-095018 4/1993

* cited by examiner

*Primary Examiner*—Chris Chu
(74) *Attorney, Agent, or Firm*—Mills & Onello, LLP

(57) ABSTRACT

Provided are a semiconductor package in which bonding pads of a semiconductor chip are electrically connected to interconnection portions by wire-bonding, and a method of manufacturing the semiconductor package. The semiconductor package includes: a substrate; an interconnection portion that is disposed on the substrate and comprises conductive patterns having a first thickness and conductive patterns having a second thickness that is smaller than the first thickness; at least one semiconductor chip that is mounted on the substrate and comprises a plurality of bonding pads; and a plurality of wires electrically connecting the conductive patterns and the bonding pads.

9 Claims, 3 Drawing Sheets

SEMICONDUCTOR PACKAGE AND METHOD OF MANUFACTURING THE SAME

CROSS-REFERENCE TO RELATED PATENT APPLICATION

This application claims priority under 35 U.S.C. §119 to of Korean Patent Application No. 10-2006-0124063, filed on Dec. 7, 2006 in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the semiconductor package, and more particularly, to a semiconductor package in which a bonding pad of a semiconductor chip is electrically connected to an interconnection portion of the semiconductor package by wire bonding, and a method of manufacturing the semiconductor package.

2. Description of the Related Art

Electronic appliances are becoming smaller, higher capacity, and increasingly multi-functional, largely owing to the continued development in the field of semiconductor integration technology and electronic engineering. One example showing this development is commercialization of portable multi-media reproducing devices, mobile phones, or various other digital appliances or devices in which functions of both of the above appliances are converged. Such digital devices, which need to be miniaturized and at the same time capable of performing multiple operations, are realized by high integration packaging technologies—such as chip scale package (CSP), system on chip (SOC), or multi-chip package.

In the case of the above high integration package technology, a semiconductor chip in the packages can be electrically connected directly to outer interconnections with solder bumps, so as to simplify an interconnection process. However, the interconnection process with the solder bumps in CSP package cannot provide such a reliable and economical interconnection as a conventional wire bonding process. So, the wire bonding process is commonly adapted to the high integration packaging technologies.

FIG. 1 is a perspective view illustrating a conventional semiconductor package 50 using a conventional wire bonding process, and FIG. 2 is a top view illustrating conventional contact pads 20 illustrated in FIG. 1.

Referring to FIGS. 1 and 2, interconnection portions 20R comprise a plurality of contact pads 20, which are separated a predetermined distance from each other and electrically isolated from each other. Contact pads 20 are arranged on a substrate 10, for example, a printed circuit board or a ceramic substrate. A semiconductor chip 30 can be attached on the substrate 10 by an adhesion layer (not shown). Bonding pads 31 are arranged on edge portions of the semiconductor chip 30 for inputting and outputting power and signals. The bonding pad 31 is electrically connected to the contact pad 20 by a wire 40. As is well-known in the art, in a wire bonding process, an end portion of the wire 40 is bonded to the contact pad 20 with wire ball 40a using a capillary (not shown), and then the other end portion of the wire 40 is bonded to the bonding pad 31 of the semiconductor chip 30 so that the bonding pad 31 and the contact pad 20 can be electrically connected.

The number of contact pads 20 and wires 40 corresponds to the number of input and output signals required to drive the semiconductor chip 30, and as described above, according to the trend of higher capacities and multi-functions of electronic products, the number of the contact pads 20 and wires 40 is gradually increasing. However, a pitch P of the contact pads 20 and a width W of the contact pads 20 are being reduced according to the demand of the miniaturization of electronic products.

During the wire bonding process, for a wire ball 40a to provide a reliable bonding property between the contact pad 20 and the wire 40, a diameter R of the wire ball 40a is required to be of a specific critical value or greater. In order to reduce the pitch P of the contact pad 20, a wire 40 having a small diameter can be used to reduce the critical value of the diameter R of the wire ball 40a. However, as the diameter of the wire decreases, a sweeping phenomenon of the wire 40 is caused during the subsequent transfer molding process of an epoxy resin, which can cause short circuit between the wires 40. Thus, there is a limitation in reducing the critical value of the diameter R of the wire ball by reducing the diameter of the wires 40.

Recently, the pitch P of the contact pad has been minimized due to the miniaturization of the electronic products; however, since the diameter of the wire ball 40a needs to be maintained at or greater than the critical value, electrical short circuit between neighboring contact pads 20 are frequently generated by the wire ball 40a during the wire bonding process. Accordingly, the number of defects of final products is increasing, and high precision wiring equipment for resolving this problem is becoming a serious factor in increasing manufacturing costs.

SUMMARY OF THE INVENTION

In accordance with the present invention, a semiconductor package can be provided that realizes sufficient bond strength between a conductive pattern and a wire, in spite of a reduction in the pitch of the wirings in the semiconductor package due to miniaturization of the semiconductor package.

In accordance with the present invention, a method of manufacturing of a semiconductor package can be provided that does not cause short circuits between neighboring wirings and which can perform a wire boding process in spite of a reduction in the pitch of the wirings in the semiconductor package due to miniaturization of the semiconductor package.

In accordance with the present invention, although the pitch of the wirings is reduced due to miniaturization of the semiconductor package, a wire ball having a diameter that is of a critical value or greater can be applied in a bonding process, thereby ensuring a sufficient bond strength between the conductive patterns and the wires and reducing defects caused by short circuits between neighboring conductive patterns.

According to an aspect of the present invention, there is provided a semiconductor package comprising: a substrate having an interconnection portion that comprises a plurality of conductive patterns, including first conductive patterns having a first thickness and second conductive patterns having a second thickness that is smaller than the first thickness; at least one semiconductor chip mounted on the substrate and comprising a plurality of bonding pads; and a plurality of wires electrically connecting the first and second conductive patterns and the bonding pads.

The first thickness can be in a range of about 15 μm-25 μm, and the second thickness can be in a range of about 5 μm-10 μm.

The first conductive patterns having a first thickness and the second conductive patterns having a second thickness can be alternately provided on the substrate.

The wires can be alternately bonded on the first conductive patterns having the first thickness and the second conductive patterns having the second thickness so as to be arranged in two or more lines.

The wires can be bonded to the conductive patterns by a wire ball.

The difference between the first thickness and the second thickness can be substantially the same as or greater than the thickness of the wire ball.

The wires can be bonded in parallel on the first and second conductive patterns.

The substrate can be a printed circuit board and the first and second conductive patterns can include at least one of contact pads and leads.

The first and second conductive patterns can be formed of at least one metal layer.

According to another aspect of the present invention, there is provided a method of manufacturing a semiconductor package, the method comprising: providing a substrate having an interconnection portion, the interconnection portion comprising a plurality of conductive patterns, including first conductive patterns having a first thickness and second conductive patterns having a second thickness that is smaller than the first thickness; providing at least one semiconductor chip on the substrate, the semiconductor chip comprising a plurality of bonding pads, including first bonding pads and second bonding pads; selectively performing a first wire bonding on one of the first and second conductive patterns to electrically connect the first bonding pads to one of the first and second conductive patterns using a first plurality of wires; and selectively performing a second wire bonding on the other of the first or second conductive patterns having the first or second thickness to electrically connect the second bonding pads to the other of the first and second conductive patterns using a second plurality of wires.

The first wire bonding process and the second wire bonding process can comprise: forming a first bonding portion by bonding one end of a wire from the first or second plurality of wires to a conductive pattern from the first and second conductive patterns using a capillary; forming a wire loop from the first bonding portion using the capillary; and forming a second bonding portion by bonding the other end of the wire to a bonding pad from the first and second bonding pads of the semiconductor chip.

The method can further comprise forming a ball bump on the bonding pad before forming the second bonding portion.

Forming a first bonding portion can comprise forming a wire ball at the one end of the wire, wherein a difference between the first thickness and the second thickness is substantially the same as or greater than the thickness of the wire ball.

The first wire bonding can be performed on the second conductive patterns having the second thickness, and the second wire bonding can be performed on the first conductive patterns having the first thickness.

The first thickness can be in a range of about 15 μm-25 μm, and the second thickness can be in a range of about 5 μm-10 μm.

Providing of the interconnection portion can comprise: first forming the first conductive patterns having a first thickness; and then etching some of the first conductive patterns to form the second conductive patterns having a second thickness.

The substrate can be a printed circuit board and the first and second conductive patterns can comprise one or more of contact pads and leads.

The conductive patterns can be formed of at least one metal layer.

According to another aspect of the present invention, there is provided a method of manufacturing a semiconductor package. The method comprises: providing a substrate having an interconnection portion, the interconnection portion comprising a plurality of conductive patterns, including first conductive patterns having a first thickness and second conductive patterns having a second thickness that is smaller than the first thickness. The providing of the interconnection portion comprises: first forming the first conductive patterns having a first thickness and then etching some of the first conductive patterns to form the second conductive patterns having a second thickness. The method also includes providing at least one semiconductor chip on the substrate, the semiconductor chip comprising a plurality of bonding pads, including first bonding pads and second bonding pads; selectively performing a first wire bonding on one of the first conductive patterns or on the second conductive patterns to electrically connect the first bonding pads to one of the first and second conductive patterns using a first plurality of wires; and selectively performing a second wire bonding on the other of the first and second conductive patterns to electrically connect the second bonding pads to the other of the first and second conductive patterns using a second plurality of wires. The first wire bonding and the second wire bonding comprise: forming a first bonding portion by bonding one end of a wire from the first or second plurality of wires to a conductive pattern from the first and second conductive patterns using a capillary; forming a wire loop from the first bonding portion using the capillary; and forming a second bonding portion by bonding the other end of the wire to a bonding pad from the first and second bonding pads of the semiconductor chip.

The forming a first bonding portion can comprise forming a wire ball at the one end of the wire, wherein a difference between the first thickness and the second thickness is substantially the same as or greater than the thickness of the wire ball.

BRIEF DESCRIPTION OF THE DRAWINGS

The above and other features and advantages of the present invention will become more apparent by describing in detail exemplary embodiments thereof with reference to the attached drawings, in which like reference numerals refer to the same or similar elements. In the drawings.

DETAILED DESCRIPTION OF THE INVENTION

Figure 1:
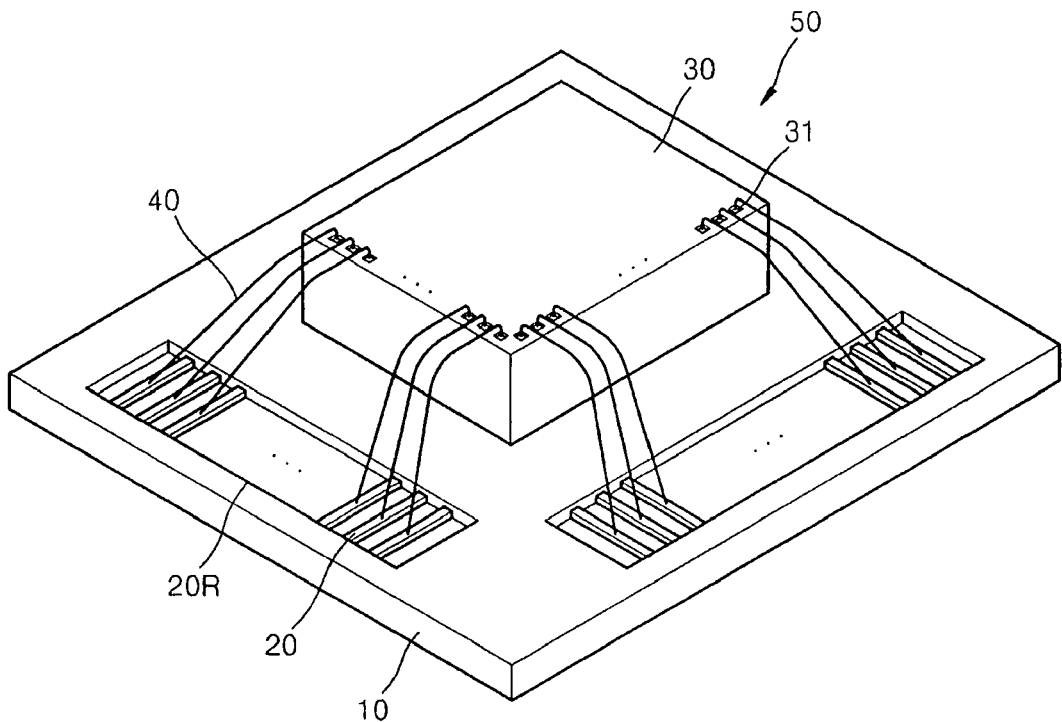
FIG. 1 is a perspective view illustrating a conventional semiconductor package using a conventional wire bonding process.
Figure 2:
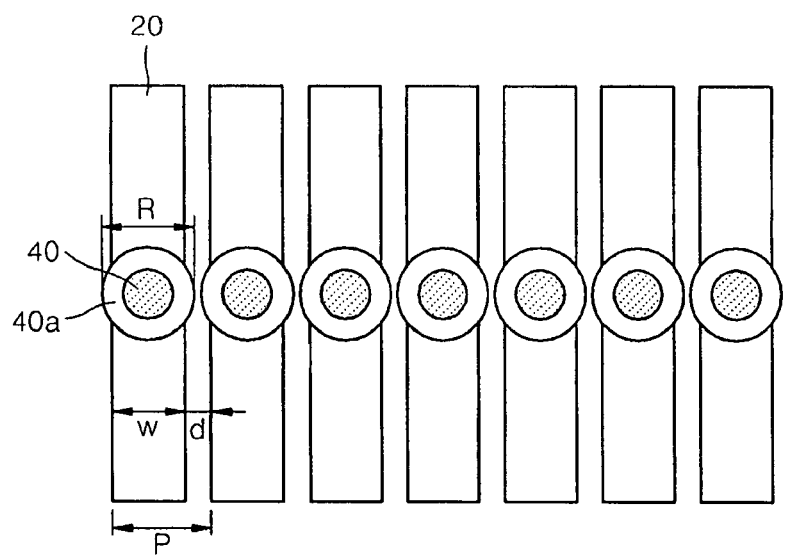
FIG. 2 is a top view illustrating a conventional contact pad 20 illustrated in FIG. 1.

Hereinafter, aspect of the present invention will now be described more fully with reference to the accompanying drawings, in which exemplary embodiments of the invention are shown.

The invention can, however, be embodied in many different forms and should not be construed as being limited to the embodiments set forth herein. It will also be understood that when a layer is referred to as being "on" another layer or substrate, it can be directly on the other layer or substrate, or intervening layers or substrate can also be present. In the drawings, the thicknesses of layers and regions are exaggerated for clarity. Like reference numerals in the drawings denote like elements, and thus their description will be omitted. The term 'and/or' refers to one of or a combination of at least two of the listed items.

In the present description, terms such as 'first', 'second', etc. are used to describe various members, components, regions, layers, and/or portions. However, the members, components, regions, layers, and/or portions should not be limited by these terms. The terms are used only for distinguishing one member, component, region, layer, or portion from another member, component, region, layer, or portion. Thus, a first member, component, region, layer, or portion which will be described can also refer to a second member, component, region, layer, or portion, without departing from the scope of the present invention.

Figure 3:
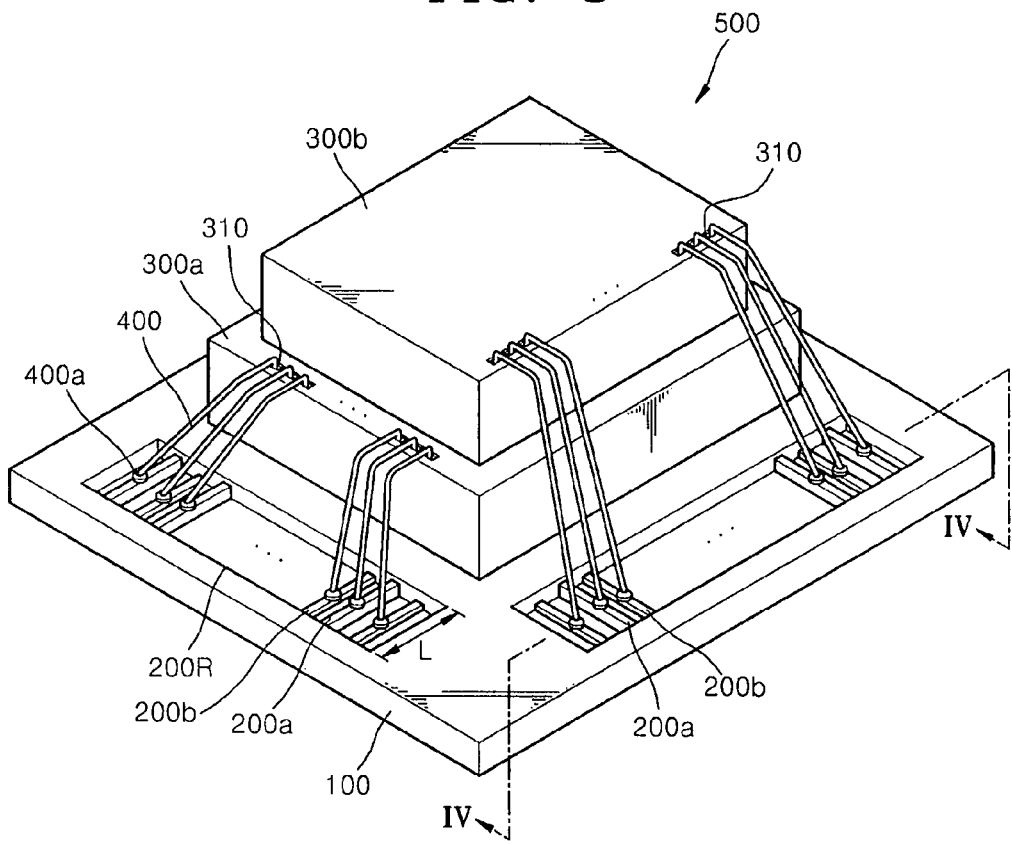
FIG. 3 is a perspective view illustrating an embodiment of a semiconductor package according to an aspect of the present invention.
Figure 4:
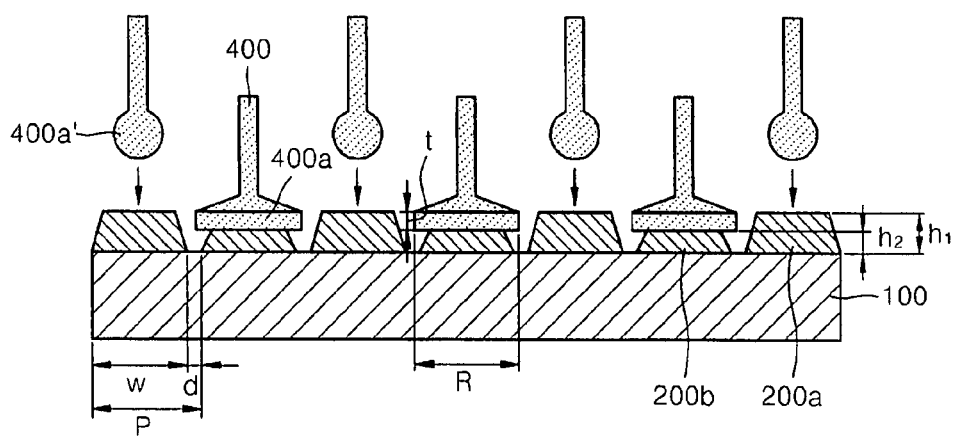
FIG. 4 is a cross-sectional view illustrating an embodiment of a wire bonding process according to an aspect of the present invention.

FIG. 3 is a perspective view illustrating an embodiment of a semiconductor package 500 according to an aspect of the present invention. FIG. 4 is a cross-sectional view an interconnection portion 200R of semiconductor package 500 of FIG. 3 taken along line IV-IV, which illustrates a wire bonding process according to an embodiment of the present invention.

Referring to FIG. 3, an interconnection portion 200R can be formed on a substrate 100 of a semiconductor package 500. The interconnection portion 200R includes a plurality of conductive patterns 200a and 200b having different thicknesses. The substrate 100 can be a printed circuit board well-known in the art, and the conductive patterns 200a and 200b can be line type contact pads or leads formed on the printed circuit board. The conductive patterns 200a and 200b can be formed of metal layers, such as nickel or copper coated with gold on a top portion thereof.

In some embodiments, as shown in FIG. 3 and FIG. 4, the interconnection portion 200R conductive patterns 200a can have a first thickness h1 and conductive patterns 200b can have a second thickness h2. For example, the first thickness h1 can be 15-25 μm, and the second thickness h2 can be 5-10 μm.

The conductive patterns 200a having the first thickness h1 and the conductive patterns 200b having the second thickness h2 can be alternately arranged as illustrated in FIG. 3 and FIG. 4. The conductive patterns 200a and 200b having different heights h1 and h2 can be formed, for example, by first forming conductive patterns having a first thickness h1 and then etching some of the conductive patterns to have a thickness h2.

Semiconductor chips 300a and 300b can be provided on the substrate 100. In some embodiments, the semiconductor chips 300a and 300b can be stacked as illustrated in FIG. 3. Alternatively, the semiconductor chips 300a and 300b can be separately disposed on different regions of the substrate 100. Bonding pads 310 can be formed on the semiconductor chips 300a and 300b for inputting and outputting power and signals.

The bonding pads 310 and conductive patterns 200a and 200b corresponding to the bonding pads 310 can be electrically connected to wires 400 by a wire bonding process. Embodiments of a wire bonding process according to various aspects of the present invention now will be described, still referring to FIG. 4.

Referring to FIG. 4, the wire bonding process can be selectively performed to the conductive patterns 200a having a first thickness "h1" and the conductive patterns 200b having a second thickness "h2." For example, the wire bonding process can be first performed on the conductive patterns 200b having the second thickness h2, and then, the wire bonding process can be performed on the other conductive patterns, i.e. the conductive patterns 200a having the first thickness h1. In other embodiments, it will be understood that a wire bonding process can be performed in a contrary order to the above described wire bonding process. For example, a wire bonding process can be first performed on the conductive patterns 200a having the first thickness h1, and then, the wire bonding process can be performed on the other conductive patterns, i.e. the conductive patterns 200b having the second thickness h2.

The wire bonding process can be performed using an approach well known to those having skill in the art. For example, a ball 400a' can be formed at an end portion of wires 400 by, for example, high voltage discharge, and a first bonding portion can be formed on the conductive patterns 200a and 200b by contacting and pressurizing the ball 400a' onto the conductive patterns 200a and 200b to form a wire ball 400a. Then, a wire loop having a predetermined locus is formed by using a capillary (not shown) from the first bonding portion, and then a second bonding portion can be formed by bonding an other end portion of the wire 400 to one of the bonding pads 310 of the semiconductor chips 300a and 300b. In some embodiments of the present invention, ball bumps can be formed on the contact pads using the capillary, as is known in the art, prior to forming the second bonding portion.

Still referring to FIG. 3 and FIG. 4, in some embodiments, a difference of thickness between the first thickness h1 and the second thickness h2 is a thickness "t" of the wire ball 400a or greater. Thus, wire balls 400a can have a same diameter "R" as a width "w" of the conductive patterns 200a and 200b and greater, even when a pitch "P" of the conductive patterns 200a and 200b is reduced while the width w of and a distance "d" between the conductive patterns 200a and 200b are reduced. This is because no short circuit is generated even when the diameter R of the wire balls 400a is increased by the distance d on both sides of the conductive patterns 200a and 200b.

As described above, according to the above embodiments, even when the pitch P of the conductive patterns 200a and 200b in a semiconductor package is reduced, a margin of a critical value of a diameter R of wire balls 400a can be preserved. So, wire balls having a diameter R enough to ensure a reliable bonding between the wires 400 and the conductive patterns 200a and 200b can be provided.

Figure 5:
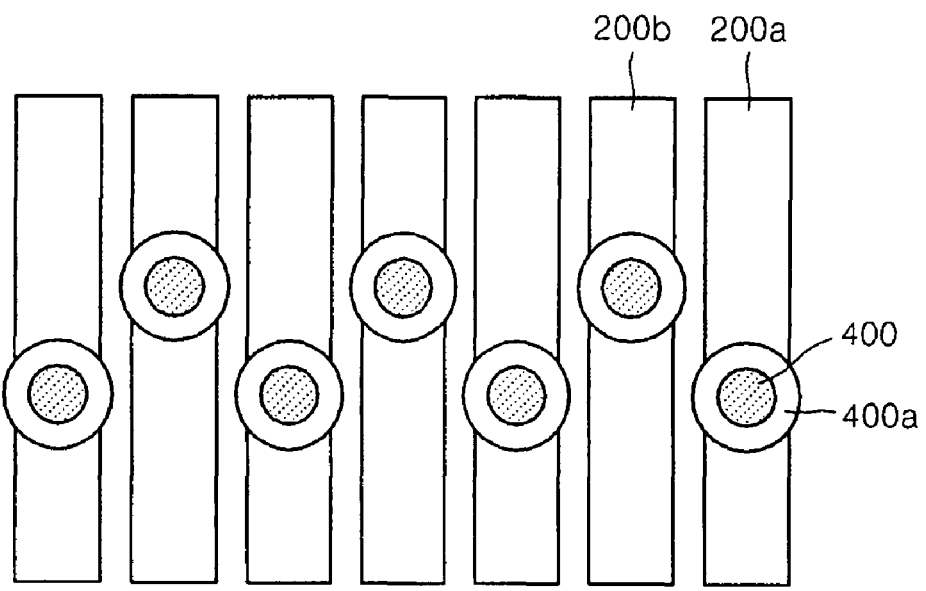
FIGS. 5 and 6 are plan views illustrating an embodiment of a wire bonding processes according to other aspects of the present invention.
Figure 6:
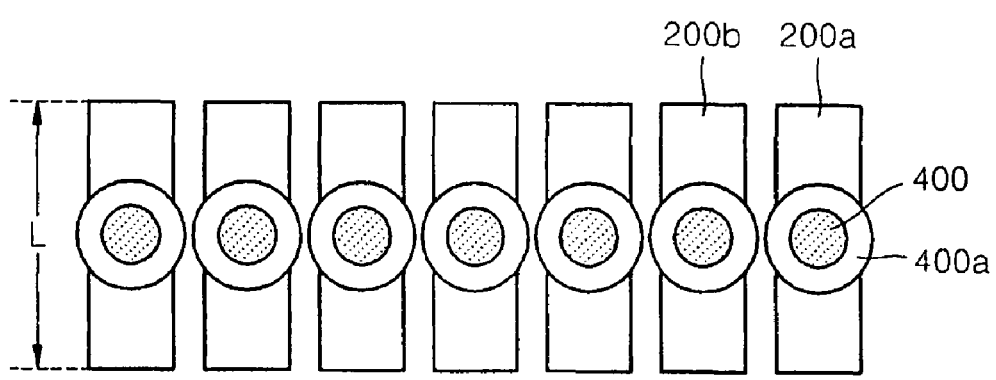

FIGS. 5 and 6 are plan views illustrating embodiments of wire bonding processes according to various aspects of the present invention.

Referring to FIG. 5, the wire bonding process according to some embodiments can be performed such that the bonding portions of the wires 400 having the wire balls 400a are alternately arranged on a conductive pattern 200a having a first thickness h1 and a conductive pattern 200b having a second thickness h2, as illustrated in FIG. 4. As illustrated in FIG. 3, in the case when at least two semiconductor chips 300a and 300b are stacked, the number of the wires 400 increases, and here, short circuits due to the wire balls 400a can be prevented by alternating the bonding position of the wire balls 400a on the conductive patterns 200a and 200b.

Referring to FIG. 6, according to other embodiments, the wire bonding process can be performed such that the wire balls 400a are provided next to each other on the conductive patterns 200a and 200b. When the size of the semiconductor package 500 illustrated in FIG. 3 is reduced to be similar to the size of the semiconductor chips 300a and 300b or the size of the semiconductor chips 300a and 300b is increased according to the demand of customers, the region of the substrate 100 in which the interconnection portions 200R can be formed can be reduced, and thus a length "L" of the conductive patterns 200a and 200b can be reduced. In this case, during the wire bonding process, it is not easy for the wire balls to be alternately provided on the conductive patterns 200a and 200b, contrary to the above embodiments described by referring to FIG. 5. However, the conductive patterns 200a and 200b can have a height difference that is the same as or greater than a thickness t of the wire balls 400a, and thus electric short circuits between the wire balls 400a can be prevented.

As described above, FIG. 3 illustrates a substrate and conductive patterns formed on the substrate; however, the present invention is not limited thereto and can also comprise various interconnection structures, for example, land, metallic bump, and wedge bond of the semiconductor package connected to the semiconductor chips by wire bonding. Also, FIG. 3 illustrates a wire bonding process using wire balls; however, wire bonding processes using a stitch method can also be applied to the present invention.

Since the semiconductor package according to the present invention includes interconnection portions comprising conductive patterns having a first thickness and conductive patterns having a second thickness that is smaller than the first thickness, wire balls having a diameter that is of a critical value or greater can be employed between the conductive patterns and the wires, even though the pitch of the conductive patterns is reduced as semiconductor packages are miniaturized. Thus sufficient bond strength can be realized and performance defects due to short circuits between the conductive patterns can be reduced.

In addition, according to the method of manufacturing a semiconductor package according to aspects of the present invention, even when the pitch of the conductive patterns is reduced as semiconductor packages are miniaturized, a first wire bonding is selectively performed on the conductive patterns having a first thickness or the conductive patterns having a second thickness, and a second wire bonding is selectively performed on the other conductive patterns to which the first wire bonding is not performed. Thus, a wire bonding process can be performed without causing short circuits between neighbouring wires and at low cost.

While the foregoing has described what are considered to be the best mode and/or other preferred embodiments, it is understood that various modifications may be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A semiconductor package comprising:
   a substrate having an interconnection portion that comprises a plurality of conductive patterns, including first conductive patterns having a first thickness and second conductive patterns having a second thickness that is smaller than the first thickness;
   at least one semiconductor chip mounted on the substrate and comprising a plurality of bonding pads; and
   a plurality of wires electrically connecting the first and second conductive patterns and the bonding pads,
   wherein the wires are bonded to the first and second conductive patterns by first and second wire balls, respectively, and
   wherein the difference between the first thickness and the second thickness is substantially the same as or greater than the thickness of the second wire ball.

2. The semiconductor package of claim 1, wherein the first thickness is in a range of about 15 μm-25 μm, and the second thickness is in a range of about 5 μm-10 μm.

3. The semiconductor package of claim 1, wherein the first conductive patterns having a first thickness and the second conductive patterns having a second thickness are alternately provided on the substrate.

4. The semiconductor package of claim 3, wherein the wires are alternately bonded on the first conductive patterns having the first thickness and the second conductive patterns having the second thickness so as to be arranged in two or more lines.

5. The semiconductor package of claim 1, wherein the wires are bonded in parallel on the first and second conductive patterns.

6. The semiconductor package of claim 1, wherein the substrate is a printed circuit board and the first and second conductive patterns include at least one of contact pads and leads.

7. The semiconductor package of claim 1, wherein the first and second conductive patterns are formed of at least one metal layer.

8. The semiconductor package of claim 1, wherein diameters of the first and second wire balls are the same as or greater than a width of the first and second conductive patterns, respectively.

9. The semiconductor package of claim 1, wherein the difference between the first thickness and the second thickness is substantially the same as or greater than the thickness of the first wire ball.

* * * * *